United States Patent [19]

Daniels et al.

[11] 3,873,852

[45] Mar. 25, 1975

[54] BINARY FREQUENCY DIVIDER CIRCUIT

[75] Inventors: R. Gary Daniels, Tempe; Harry A. Kuhn, Jr., Phoenix, both of Ariz.

[73] Assignee: Motorola, Inc., Chicago, Ill.

[22] Filed: Nov. 12, 1973

[21] Appl. No.: 415,097

[52] U.S. Cl. .............. 307/225 C, 307/279, 307/304

[51] Int. Cl. ....................... H03k 21/00, H03k 23/08

[58] Field of Search ........ 307/220 R, 220 C, 225 R, 307/225 C, 279, 304

[56] References Cited

UNITED STATES PATENTS

| | | | |
|---|---|---|---|
| 3,619,644 | 11/1971 | Vittoz | 307/279 |
| 3,679,913 | 7/1972 | Foltz | 307/279 |
| 3,753,009 | 8/1973 | Clapper | 307/279 |

*Primary Examiner*—Stanley D. Miller, Jr.

*Attorney, Agent, or Firm*—Vincent J. Rauner; Charles R. Hoffman

[57] ABSTRACT

A binary frequency divider circuit suitable for cascade operation is provided. A plurality of complementary MOS transistors are interconnected to provide a pair of complementary inverters and also to provide a pair of complementary combinational logic gates which function similarly to AND/OR combinational logic gates for the particular case wherein complementary logic input signals are provided.

4 Claims, 3 Drawing Figures

BINARY FREQUENCY DIVIDER CIRCUIT

RELATED PATENTS

This application is related to U.S. Pat. No. 3,679,913 by James W. Foltz, filed Sept. 14, 1970 and assigned to the assignee of the present application.

BACKGROUND OF THE INVENTION

In the area of digital systems, wherein low power dissipation is required, as in electronic timepieces, complementary insulated gate field-effect transistor frequency dividers have been utilized. Some prior art complementary insulated gate field-effect transistor circuitry has achieved this function through provision of complementary field-effect transistor combinational logic gate stages wherein four or more complementary field-effect transistors have drains and/or sources connected to a common node. Such prior art circuit configurations have two serious drawbacks. The first drawback being that the layout, or topology, of the integrated circuit device wastes chip area and is therefore expensive. The second drawback being that the large parasitic capacitance associated with the aforementioned common node seriously limits the maximum frequency of operation of the frequency divider circuit and increases the power dissipation.

SUMMARY OF THE INVENTION

This invention relates to digital circuitry, and more particularly to triggerable flip-flop frequency divider circuits which consume very small amounts of power and are appropriate for use as a cascaded frequency divider circuit.

In view of the foregoing shortcomings of the prior art, it is an object of this invention to provide a new and improved triggerable flip-flop frequency divider circuit.

It is another object of this invention to provide a new and improved triggerable flip-flop frequency divider circuit which utilizes complementary insulated gate field-effect transistors.

It is another object of this invention to provide a new and improved frequency divider circuit wherein combinational logic gates are provided which have reduced parasitic capacitance therein.

It is another object of this invention to provide an improved frequency divider circuit which reduces the area required on an integrated semiconductor chip.

Briefly described, the invention is an improved triggerable flip-flop frequency divider circuit which includes two complementary insulated gate field-effect transistor inverters and two complementary insulated gate field-effect transistor combinational logic gates. One of the inverters and one of the combinational logic gates are connected to form a first gated latch, and the other inverter and combinational logic gate are connected to form a second gated latch. Each combinational logic gate includes first and second complementary switching means. Both of the first and second complementary switching means of each combinational logic gate includes first, second, third, and fourth insulated gate field-effect transistors, wherein a main electrode of the first insulated gate field-effect transistor is connected solely to a main electrode of the second insulated gate field-effect transistor, and a main electrode of the third insulated gate field-effect transistor is connected solely to a main electrode of the fourth insulated gate field-effect transistor.

DESCRIPTION OF THE INVENTION

Figure 1:
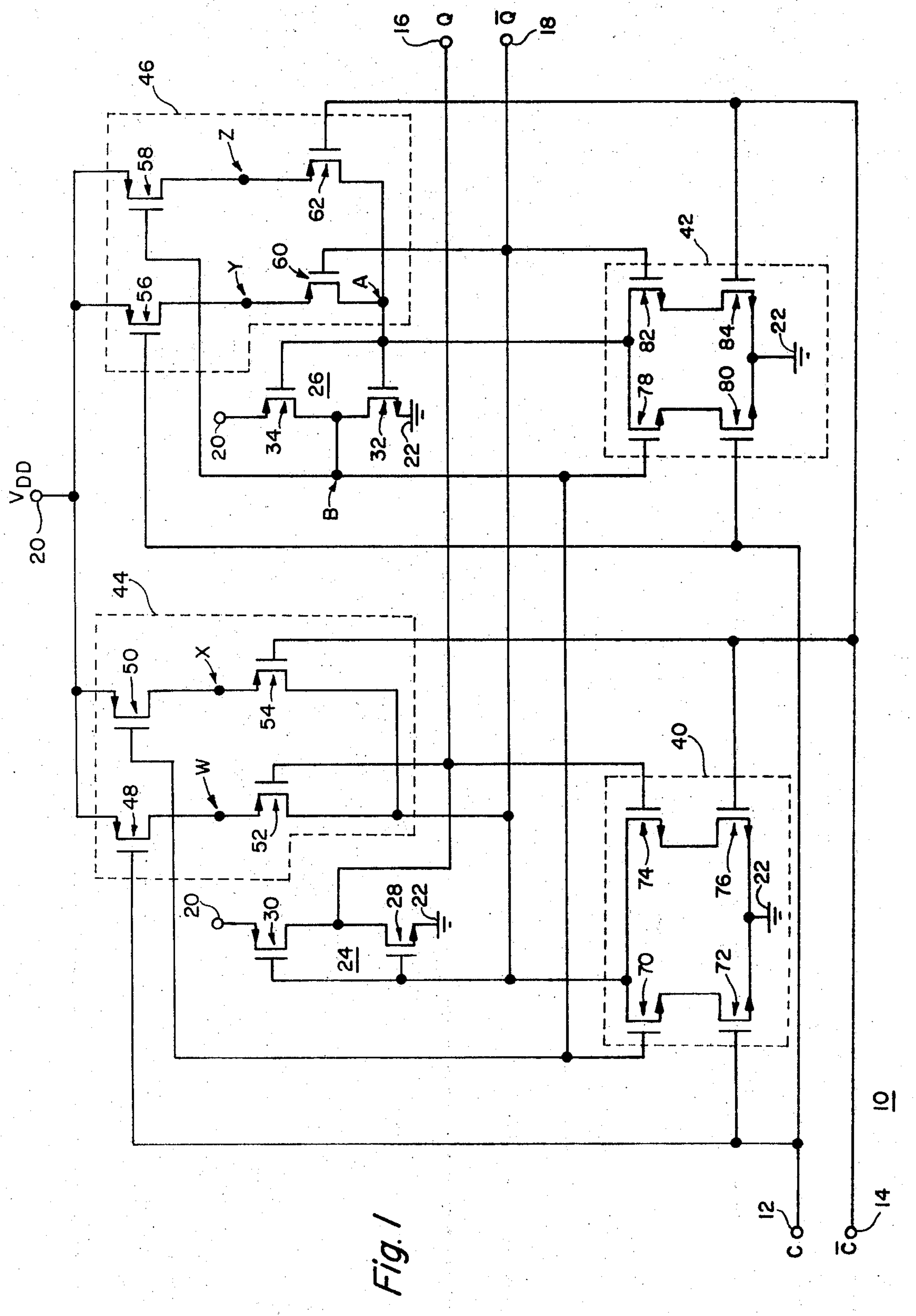
FIG. 1 is a schematic drawing of a preferred embodiment of the invention.

A preferred embodiment of the invention is shown in the schematic diagram of FIG. 1, wherein triggerable frequency divider circuit 10 (hereinafter simply called a frequency divider circuit) includes input terminals 12 and 14 having, respectively, complementary input signals C and $\overline{C}$ applied thereto. Frequency divider circuit 10 also includes output terminals 16 and 18 having, respectively, output signals Q and $\overline{Q}$ generated thereon by frequency divider circuit 10. The frequency of signals Q and $\overline{Q}$ is half that of input signals C and $\overline{C}$. Frequency divider circuit 10 further includes first power supply terminal 20 and second power supply terminal 22.

Frequency divider circuit 10 includes complementary inverters 24 and 26. Complementary inverter 24 includes a P-channel insulated gate field-effect transistor (IGFET) 30 and N-channel IGFET 28, the latter having its source electrode connected to second power supply terminal 22 and its drain electrode connected to the drain electrode of IGFET 30 and also to output terminal 16. The source of IGFET 30 is connected to first power supply terminal 20. Similarly, complementary inverter 26 includes a series connection of P-channel IGFET 34 and N-channel IGFET 32 connected in series between power supply terminals 20 and 22, and having its output connected to node B.

Frequency divider circuit 10 further includes first and second switching means 40 and 42 connected to power supply terminal 22. First switching circuit means 40 is connected to output terminal 18 and also to third switching circuit means 44. Second switching circuit means 42 is connected to fourth switching circuit means 46. Third and fourth switching circuit means 44 and 46 are each connected to first power supply terminal 20.

First and third switching means 40 and 44 together form a combinational logic gate which functions similarly to a complementary IGFET two-input AND/NOR gate, if the input signals applied to terminals 12 and 14 are complementary square waves. Third switching circuit means 44 includes P-channel IGFETs 48 and 50 having their drain electrodes connected, respectively, to nodes W and X, and further having their source electrodes connected to first power supply terminal 20. Third switching circuit means 44 also includes P-channel IGFETs 52 and 54 which have their source electrodes connected, respectively, to nodes W and X and their drain electrodes connected to output terminal 18. First switching circuit means 40 includes N-channel IGFETs 70 and 72 connected in series between output terminal 18 and second power supply terminal 22, and further includes N-channel transistors 74 and 76 connected in series between output terminal 18 and power supply terminal 22. The gate electrode of IGFET 70 is connected to the gate electrode of IGFET 50 and also to node B. Similarly, the gate electrode of IGFET 74 is connected to the gate electrode of IGFET 52 and also to output terminal 16. The gate electrodes of IGFETs 48 and 72 are connected to input terminal 12, and the gate electrodes of IGFETs 54 and 76 are connected to input terminal 14. The combinational logic circuit formed by first switching circuit means 40 and thrid switching circuit means 44 is similar to a conventional complementary IGFET two-input AND/NOR gate, the difference being that in the latter nodes W and X are connected together.

According to the invention, nodes W and X are not interconnected, and, as will be explained hereinafter, the functioning of the combinational logic circuit is equivalent to the functioning of said conventional complementary two-input AND/NOR gate as long as C and $\bar{C}$, the signals on input terminals 12 and 14, respectively, are complementary signals. As is also explained hereinafter, breaking the connection between nodes W and X provides substantial advantages in reduction of size of the circuit for a low threshold voltage, silicon gate complementary IGFET process and also in substantially improved performance due to the reduction of stray capacitance on the corresponding node of the prior art conventional complementary two-input AND/NOR circuit.

Similarly, second switching circuit means 42 and fourth switching circuit means 46 are connected to form a second complementary IGFET two-input combinational logic gate similar to the one previously described. P-channel IGFETs 56 and 60 are connected in series between node A and first power supply terminal 20, the drain of IGFET 56 and the source of IGFET 60 being connected to node Y. IGFETs 58 and 62 are also connected in series between node A and first power supply terminal 20, the drain of IGFET 58 and the source of IGFET 62 being connected to node Z. In second switching circuit means 42 IGFETs 78 and 80 are connected in series between node A and second power supply terminal 22, and IGFETs 82 and 84 are also connected in series between node A and second power supply terminal 22. The gate electrodes of IGFETs 56 and 80 are connected to input terminal 12. The gate electrodes of IGFETs 58 and 78 are connected to node B. The gate electrodes of IGFETs 60 and 82 are connected to output node 18, and the gate electrodes of IGFETs 62 and 84 are connected to input terminal 14.

It will be recognized by those skilled in the art that insulated gate field-effect transistors have two main electrodes, a source electrode, a drain electrode, and also a gate electrode. It will be further recognized that the source electrode and the drain electrode are generally interchangeable, depending on the relative voltages thereon since an IGFET is generally a bilateral device. It is the intent herein that a particular main electrode is referred to as a source or a drain in order to designate that particular main electrode as well as to indicate its main function during circuit operation. However, a main electrode designated as a source may function as a drain during part of the circuit operation.

It should be recognized that various modifications in the manner and order of interconnecting the two combinational logic gates and the two complementary inverters may be made within the scope of the invention.

Figure 2:
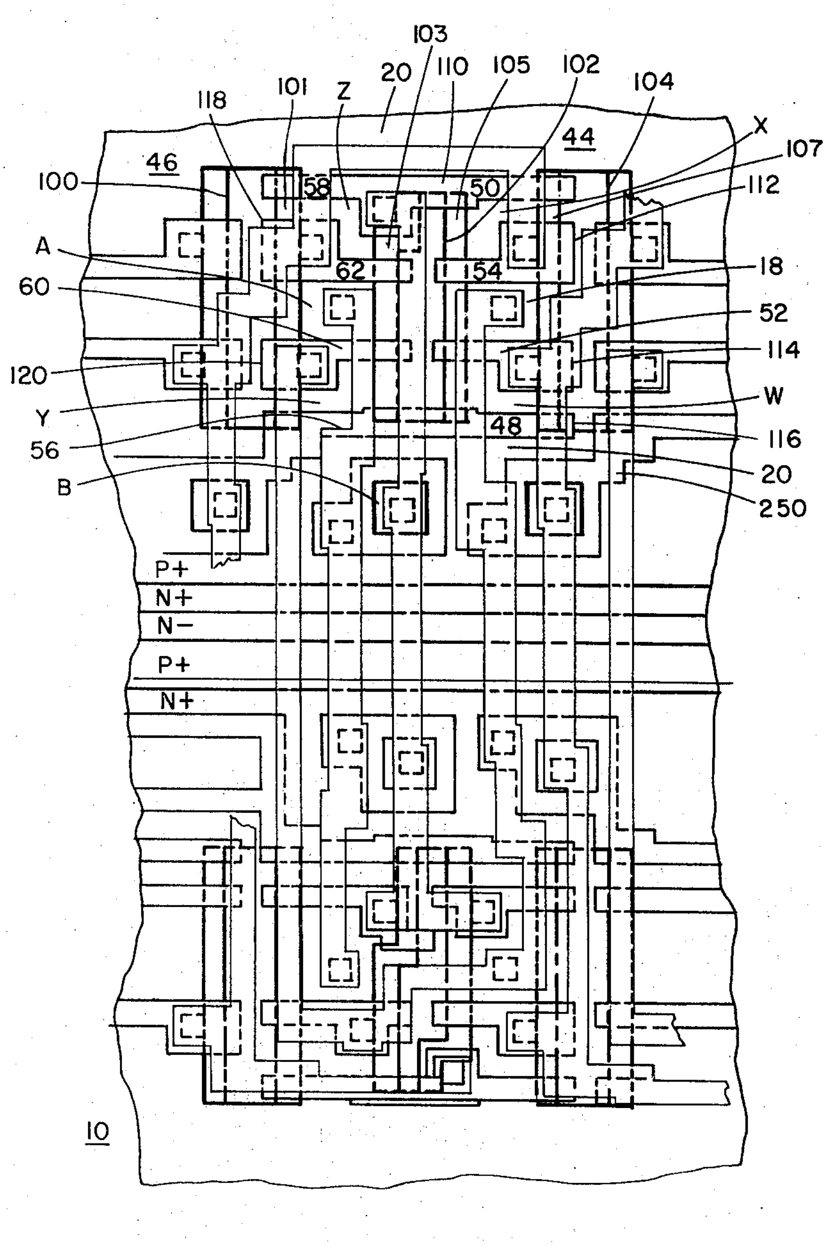
FIG. 2 is a plan view of a silicon gate IGFET integrated circuit implementation of the embodiment of FIG. 1, and is useful in describing the advantages of the invention.

The aforementioned advantages of the improved frequency divider circuit of the invention will become clear upon reading the following and upon inspection of the plan view of the integrated circuit implementation thereof shown in FIG. 2.

Although the integrated circuit layout, or topology, for the entire frequency divider circuit 10 of FIG. 1 is included in FIG. 2, the following discussion specifically refers only to the portion thereof including third and fourth circuit switching means 44 and 46 (of FIG. 1) wherein the improvement of the invention resides. Specifically, it is seen in FIG. 2 that P-channel IGFETs 50, 54, 52 and 48 of switching circuit means 44 are arranged in the indicated order so that the portion of P-type region 20 at the top of FIG. 2 is the source of IGFET 50. The reference numeral 20 is used to designate both first power supply terminal 20 and P-type region 20 because they are connected together and have the same voltage thereon. Polycrystalline silicon region 110 forms the gate electrode of IGFET 50, and a P-type region X forms the drain of IGFET 50 and also the source of IGFET 54. The letter X is also utilized to designate the corresponding node in the schematic diagram of FIG. 1. Similarly, polycrystalline silicon region 112 forms the gate electrode of IGFET 54, and P-type region 18 forms the drain region of IGFET 54 and also of IGFET 52. P-type region W forms the source region of IGFET 52 and the drain region of IGFET 48. P-type region 20 forms the source region of IGFET 48. Polycrystalline silicon regions 114 and 116 form the gate electrodes of IGFETs 52 and 48, respectively.

The layout of switching circuit means 46 is similar to that of switching circuit means 44, wherein IGFETs 58, 62, 60 and 56 are arranged in the indicated manner, so that the portion of P-type region 20 at the top of FIG. 2 is the source of IGFET 58. Polycrystalline silicon regions 110, 118, 120 and 116 form the gate electrodes of IGFETs 58, 62, 60 and 56, respectively. P-type region A forms the drains of IGFETs 60 and 62. P-type region Y forms the source of IGFET 60 and the drain of IGFET 56. P-type region Z forms the source of IGFET 62 and the drain of IGFET 58.

Before discussing FIG. 2 further, it should be noted that for a low threshold voltage process for complementary insulated gate field-effect transistor integrated circuits, guard regions are frequently formed such that they are overlapped by the end portions of the polycrystalline silicon gate regions of each P-channel field-effect transistor to prevent parasitic channels from being formed around the ends of each P-channel IGFET. In FIG. 2, the guard regions include $N^+$ guard regions 100, 102, and 104, and also undiffused regions 101, 103, 105 and 107. Such guard regions require a substantial amount of area of the semiconductor chip, thereby increasing the size of the circuit and consequently increasing its cost and also reducing the performance of the circuit because of the increased stray capacitance which necessarily results from increased size.

The improvement according to the invention eliminates the prior art connection between nodes W and X, so that the P-type drain regions of IGFETs 48 and 50 need not be interconnected; similarly, the prior art connection between nodes Y and Z are also eliminated, so that the drains of IGFETs 56 and 58 need not be connected. Such connections would clearly require extensions of P-type material which would have to go from, for example, node X through guard region 102 and undiffused region 105 to node W. Therefore, it is clear that $N^+$ guard region 102 would have to be divided and space provided between the divided portions thereof so that each such extension could pass around and be spaced from the adjacent $N^+$ guard region. Further, an additional guard region would need to be provided between each such extension to prevent undesired parasitic coupling therebetween.

It is therefore seen that the result of eliminating the connections between nodes W and X and also eliminating the connection between nodes Y and Z substantially reduces the width of the layout in FIG. 2 by eliminating the aforementioned extensions of P-type material and the additional guard regions and spacings required. It has been found that a 40 percent reduction in chip area for the frequency divider circuit 10 may be achieved, using the aforementioned circuit and layout thereof. Further, the parasitic capacitance of nodes W, X, Y and Z are all substantially reduced, improving the frequency of operation and the power dissipation of the circuit at the specified operating voltage.

It should also be noted that the use of silicon crossover 250 facilitates cascading of frequency divider circuits.

It should further be recognized that frequency divider circuits utilizing metal gate IGFETs having diffused or thick oxide guard regions are deemed within the scope of the invention, as are silicon gate IGFETs with thick oxide guard regions.

Figure 3:
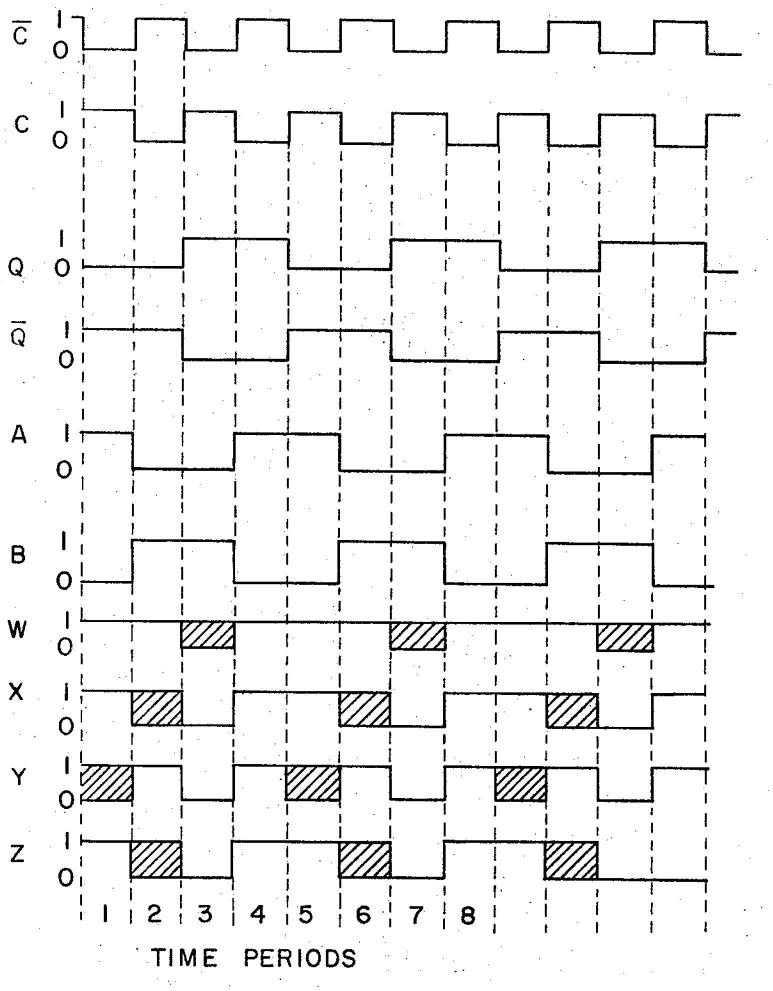
FIG. 3 is a timing diagram useful in explaining the operation of the embodiment shown in FIG. 1.

The operation of the frequency divider circuit of FIG. 1 is now briefly described with reference to the timing diagram of FIG. 3. The timing diagram of FIG. 3 shows the voltages which appear at various nodes and terminals of the frequency divider circuit. The letters used in FIG. 3 to designate the waveforms are the same as are used to designate the corresponding nodes and terminals in the schematic diagram of FIG. 1.

The operation of the frequency divider circuit 10 may be determined by referring to Table I, wherein the condition ("on" or "off") of each IGFET in the frequency divider circuit is listed for each of the first four time periods of the timing diagram in FIG. 3.

The conditions listed in TABLE I describe the operation of the frequency divider circuit 10 for the illustrated input waveforms C and $\bar{C}$ for the first four time periods, with the assumption being made that initially (i.e., during the first time frame) output Q is at a logical "0" and node A is at a logical "1." The operation is repeated for each subsequent four time periods. (A more detailed description of the logical operation of a similar prior art frequency divider circuit may be found in the aforementioned related U.S. Pat. No. 3,679,913 by James W. Foltz).

TABLE I

| | | Time Frame | | | |
|---|---|---|---|---|---|
| | | 1 | 2 | 3 | 4 |
| Gated Latch 1 | 48 | OFF | ON | OFF | ON |
| | 50 | ON | OFF | OFF | ON |
| | 52 | ON | ON | OFF | OFF |
| | 54 | ON | OFF | ON | OFF |
| | 70 | OFF | ON | ON | OFF |
| | 74 | OFF | OFF | ON | ON |
| | 72 | ON | OFF | ON | OFF |
| | 76 | OFF | ON | OFF | ON |
| | 30 | OFF | OFF | ON | ON |
| | 28 | ON | ON | OFF | OFF |
| Gated Latch 2 | 56 | OFF | ON | OFF | ON |
| | 58 | ON | OFF | OFF | ON |
| | 60 | OFF | OFF | ON | ON |

TABLE I-Continued

| | Time Frame | | | |
|---|---|---|---|---|
| | 1 | 2 | 3 | 4 |
| 62 | ON | OFF | ON | OFF |
| 78 | OFF | ON | ON | OFF |
| 82 | ON | ON | OFF | OFF |
| 80 | ON | OFF | ON | OFF |
| 84 | OFF | ON | OFF | ON |
| 34 | OFF | ON | ON | OFF |
| 32 | ON | OFF | OFF | ON |

It should be noted, in analyzing the frequency divider circuit 10, that it consists of a first gated latch cross coupled to a second gated latch, designated in Table I as Gated Latch 1 and Gated Latch 2, respectively. Gated Latch 1 includes first complementary IGFET inverter 24 and the first complementary combinational logic gate comprised of first switching circuit means 40 and third switching circuit means 44. Gated Latch 2 includes second complementary IGFET inverter 26 and the second complementary combinational logic gate comprised of second switching circuit means 42 and fourth switching circuit means 46 (in FIG. 1).

It should be noted that the cross-hatched areas of the waveforms at nodes W, X, Y, and Z indicate that the voltage may vary on these nodes during the time periods indicated by the cross-hatching; however, voltage changes occurring during the periods indicated by the hatched areas are not important, because during such periods the nodes are connected only to main electrodes of IGFETs in the "off" condition. It is clear that the voltages on nodes W, X, Y and Z during the time periods indicated by the cross-hatched areas represent "don't care" conditions. In other words, during these times it would not matter if node W was or was not connected to node X. Similarly, it would not matter during such periods if node Y was or was not connected to node Z. It is further clear from examination of FIG. 3 that there are no discrepancies in the voltages on nodes W and X during the time periods which do not represent "don't care" conditions. Thus, it does not matter for low frequency operation whether or not node W or X are connected together or not during normal operation of frequency divider circuit 10. A similar argument indicates that it does not matter for low frequency operation whether or not nodes Y and Z are connected or not. It is clear that the modified combinational logic gates of the invention operate, under the conditions specified in FIG. 3, exactly like conventional complementary IGFET AND/NOR gates. However, as described hereinbefore, the modifications provide substantial reduction in circuit size and improvements in operation of the circuit.

While the invention has been described with reference to a particular embodiment thereof, those skilled in the art will recognize that variations in arrangement of parts may be made to suit various requirements without departing from the spirit and scope of the invention.

What is claimed is:

1. A frequency divider circuit comprising:
first and second input terminals;
first and second output terminals;
first and second voltage conductor means;
first and second inverter circuit means each having an input terminal and an output terminal;

first and second combinational logic gates each of said first and second combinational logic gates including first and second voltage conductor means, an output terminal, first, second, third, and fourth input terminals, first switching circuit means coupled between said first voltage conductor means and said output terminal, second switching circuit means coupled between said output terminal and said second voltage conductor means, said first switching circuit means including first, second, third, and fourth electron control means of a first conductivity type each having first and second main electrodes and a control electrode thereof, said first electron control means having its first main electrode coupled to said first voltage conductor means, its second main electrode coupled to said first voltage conductor means, its second main electrode coupled to said first main electrode of said third electronic control means, and its control electrode coupled to said first input terminal, said third electron control means having its second main electrode coupled to said output terminal and its control electrode coupled to said third input terminal, said second electron control means having its first main electrode coupled to said first voltage conductor means, its second main electrode coupled to said first main electrode of said fourth electron control means, and its control electrode coupled to said second input terminal, said fourth electron control means having its second main electrode coupled to said output terminal and its control electrode coupled to said fourth input terminal, wherein said second main electrode of said first electron control means is not connected to said second main electrode of said second electron control means, said second switching circuit means including fifth, sixth, seventh, and eigth electron control means of a second conductivity type each having first and second main electrodes and a control electrode;

said input terminal of said first inverter circuit means being coupled to said output terminal of said first combinational logic gate and to said second output terminal of said frequency divider circuit and to one of said third and fourth input terminals of said second combinational logic gate;

said output terminal of said first inverter circuit means being coupled to said first output terminal of said frequency divider circuit and to one of said third and fourth input terminals of said first combinational logic gate;

said input terminal of said second inverter circuit means being coupled to said output terminal of said second combinational logic gate;

said output terminal of said second inverter circuit means being coupled to one of said first and second input terminals of said first combinational logic gate and to one of said first and second input terminals of said second combinational logic gate;

said first input terminal of said frequency divider circuit being coupled to the other of said first and second input terminals of said second combinational logic gate and to the other of said first and second input terminals of said first combinational logic gate; and said second input terminal of said frequency divider circuit being coupled to the other of third and fourth input terminals of said first combinational logic gate and to the other of said third and fourth input terminals of said second combinational logic gate, said first and second voltage conductor means of said first and second combinational logic gates being coupled, respectively, to said first and second voltage conductor means of said frequency divider circuit.

2. A frequency divider circuit comprising:

first and second input terminals;

first and second output terminals;

first and second voltage conductor means;

first and second inverter circuit means each having an input terminal and an output terminal;

first and second combinational logic gates each of said first and second combinational logic gates including first and second voltage conductor means, an output terminal, first, second, third, and fourth input terminals, first switching circuit means coupled between said first voltage conductor means and said output terminal, second switching circuit means coupled between said output terminal and said second voltage conductor means, said first switching circuit means including first, second, third, and fourth electron control means of a first conductivity type each having first and second main electrodes and a control electrode thereof, said first electron control means having its first main electrode coupled to said first voltage conductor means, its second main electrode coupled to said first main electrode of said third electronic control means, and its control electrode coupled to said first input terminal, said third electron control means having its second main electrode coupled to said output terminal and its control electrode coupled to said third input terminal, said second electron control means having its first main electrode coupled to said first voltage conductor means, its second main electrode coupled to said first main electrode of said fourth electron control means, and its control electrode coupled to said second input terminal, said fourth electron control means having its second main electrode coupled to said output terminal and its control electrode coupled to said fourth input terminal, wherein said second main electrode of said first electron control means is not connected to said second main electrode of said second electron control means, said second switching circuit means including fifth, sixth, seventh, and eighth electron control means of a second conductivity type each having first and second main electrodes and a control electrode, said first, second, third, and fourth electron control means being P-Channel insulated gate field-effect transistors, said fifth, sixth, seventh, and eighth electron control means being N-Channel insulated gate field-effect transistors, said first main electrodes being source electrodes and said second main electrodes are drain electrodes and said control electrodes are gate electrodes, said first through said eighth insulated gate field-effect transistors being silicon gate insulated gate field-effect transistors;

said input terminal of said first inverter circuit means being coupled to said output terminal of said first combinational logic gate and to said second output terminal of said frequency divider circuit and to said third input terminal of said second combinational logic gate;

said output terminal of said first inverter circuit means being coupled to said first output terminal of said frequency divider circuit and to said third input terminal of said first combinational logic gate;

said input terminal of said second inverter circuit means being coupled to said output terminal of said second combinational logic gate;

said output terminal of said second inverter circuit means being coupled to said second input terminal of said first combinational logic gate and to said second input terminal of said second combinational logic gate;

said first input terminal of said frequency divider circuit being coupled to said first input terminal of said second combinational logic gate and to said first input terminal of said first combinational gate; and said second input terminal of said frequency divider circuit being coupled to said fourth input terminal of said first combinational logic gate and to said fourth input terminal of said second combinational logic gate, said first and second voltage conductor means of said first and second combinational logic gates being coupled, respectively, to said first and second voltage conductor means of said frequency divider circuit.

3. The frequency divider circuit as recited in claim 2 wherein said first and second inverter circuit means each comprise a first P-channel insulated gate field-effect transistor having its source electrode coupled to said first power supply terminal and its drain electrode coupled to said output terminal thereof, and a second N-channel insulated gate field-effect transistor having its source electrode coupled to said second power supply means and its drain electrode coupled to said output terminal of said inverter circuit means, said gate electrodes of said first P-channel insulated gate field-effect transistor and said second N-channel insulated gate field-effect transistor being coupled to said input terminal of said inverter circuit means.

4. A cascaded frequency divider circuit comprising a plurality of frequency divider circuits as recited in claim 3, said first output terminal of each of said frequency divider circuits being coupled to said second input terminal of a succeeding frequency divider circuit, and said second output terminal of each of said frequency divider circuits being coupled to said first input terminal of said succeeding frequency divider circuit.

* * * * *